(12) United States Patent
Ko

(10) Patent No.: US 7,317,294 B2
(45) Date of Patent: Jan. 8, 2008

(54) PULSE GENERATOR AND METHOD THEREOF

(75) Inventor: Eck-sang Ko, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 163 days.

(21) Appl. No.: 11/328,136

(22) Filed: Jan. 10, 2006

(65) Prior Publication Data

US 2006/0214610 A1    Sep. 28, 2006

(30) Foreign Application Priority Data

Jan. 13, 2005    (KR) ...................... 10-2005-0003183

(51) Int. Cl.
*H02P 5/40* (2006.01)
*H02P 8/00* (2006.01)

(52) U.S. Cl. ...................... 318/603; 318/608; 318/618; 318/254; 702/124; 700/276; 708/103

(58) Field of Classification Search ................ 318/254, 318/600–608, 618; 702/124; 700/276; 708/103
See application file for complete search history.

(56) References Cited

U.S. PATENT DOCUMENTS

| | | | | |
|---|---|---|---|---|
| 4,282,468 A | * | 8/1981 | Barker et al. ................ 318/608 |
| 4,528,491 A | * | 7/1985 | Takeuchi et al. ............ 318/603 |
| 4,961,036 A | * | 10/1990 | Arikawa ...................... 318/603 |
| 5,350,988 A | * | 9/1994 | Le ............................... 318/618 |
| 6,003,053 A | * | 12/1999 | Tanaka et al. ............... 708/103 |
| 6,504,876 B1 | | 1/2003 | Suto |
| 6,574,579 B1 | * | 6/2003 | Watanabe .................... 702/124 |
| 7,050,885 B2 | * | 5/2006 | Fiegle et al. ................. 700/276 |

FOREIGN PATENT DOCUMENTS

| | | |
|---|---|---|
| JP | 02-188195 | 7/1990 |
| JP | 08-070595 | 3/1996 |

* cited by examiner

*Primary Examiner*—Paul Ip
(74) *Attorney, Agent, or Firm*—Harness, Dickey & Pierce, P.L.C.

(57) ABSTRACT

A pulse generator and method thereof. The pulse generator may include a first switching unit receiving a plurality of receiving a plurality of time interval indicators and a first selection signal. The first switching unit may select one of the plurality of time interval indicators in accordance with the first selection signal and may output the selected time interval indicator. The pulse generator may further include a second switching unit receiving a plurality of pulse states and a second selection signal. The second switching unit may select one of the plurality of pulse states in accordance with the second selection signal and may output the selected pulse state for a first time interval, where the first time interval may be determined by the selected time interval indicator.

20 Claims, 3 Drawing Sheets

PULSE GENERATOR AND METHOD THEREOF

PRIORITY STATEMENT

This application claims the benefit of Korean Patent Application No. 10-2005-0003183, filed on Jan. 13, 2005, in the Korean Intellectual Property Office, the disclosure of which is incorporated herein in its entirety by reference.

BACKGROUND OF THE INVENTION

1. Field of the Invention

The present invention relates to a pulse generator and method thereof, and more particularly, to a pulse generator for generating a plurality of pulses and method thereof.

2. Description of the Related Art

Multiple pulses (e.g., four or more) may be used conventionally in order to control a direct current (DC) motor. Conventional micro-control units (MCUs) may include a hardware device having accessory circuits in addition to a counter circuit to generate the multiple pulses for a desired period and at a desired duty cycle.

FIG. 1A is a timing chart illustrating a conventional pulse generation method in accordance with a conventional pulse generator. FIG. 1B is a block diagram illustrating a conventional pulse generator for performing the pulse generation method of FIG. 1A.

Referring to FIGS. 1A and 1B, values representing a period and a duty cycle of a pulse may be stored in a period value storage register 11 and a duty value storage register 12, respectively. If a value of a clock signal counted by a counter is determined to be lower than the duty cycle, a higher logic pulse may be generated. Otherwise, if the value of the clock signal counted by the counter is higher than the duty cycle, a lower logic pulse may be generated. Thus, a conventional counter-based pulse generator may manage two time values to generate a pulse for controlling the duty cycle and the period.

However, many applications (e.g., related to DC motors such as step motor or servo motors) may require a multi-pulse having a plurality of different duty cycles within a single period. A multi-pulse may refer to a plurality of pulses with different duty cycles in the same period.

A multi-pulse may be generated with a conventional MCU by connecting a plurality of pulse generators in parallel with one another. As the number of pulses increases due to the multiple pulses in the multi-pulse via the parallel connection, a number of hardware devices in the MCU may likewise increase in proportion to the increasing number of pulses in the multi-pulse. Thus, again referring to FIG. 1B, as the number of pulses in the multi-pulse increases, additional counters 13, comparators 14 and 15, period value storage registers 11 and/or duty value storage registers 12 may be required to achieve the multi-pulse. As an amount of hardware increases in the MCU, a size of a chip may likewise increase.

SUMMARY OF THE INVENTION

An example embodiment of the present invention is directed to a pulse generator for generating a plurality of pulse signals, including a first switching unit receiving a plurality of time interval indicators and a first selection signal, selecting one of the plurality of time interval indicators in accordance with the first selection signal and outputting the selected time interval indicator and a second switching unit receiving a plurality of pulse states and a second selection signal, selecting one of the plurality of pulse states in accordance with the second selection signal and outputting the selected pulse state for a first time interval, the first time interval determined by the selected time interval indicator.

Another example embodiment of the present invention is directed to a method of generating a plurality of pulse signals, including receiving a plurality of time interval indicators, each of the plurality of time interval indicators associated with one of a plurality of pulse states, selecting a first of the plurality of time interval indicators, the first of the plurality of time interval indicators indicating a first time interval and outputting a first of the plurality of pulse states for the first time interval.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS THE PRESENT INVENTION

Figure 1A:
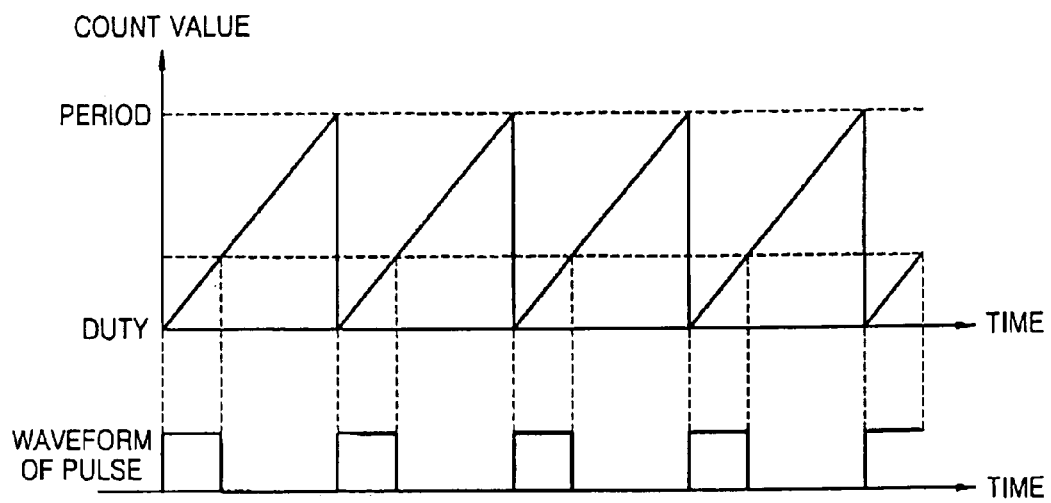
FIG. 1A is a timing chart illustrating a conventional pulse generation method in accordance with a conventional pulse generator.
Figure 1B:
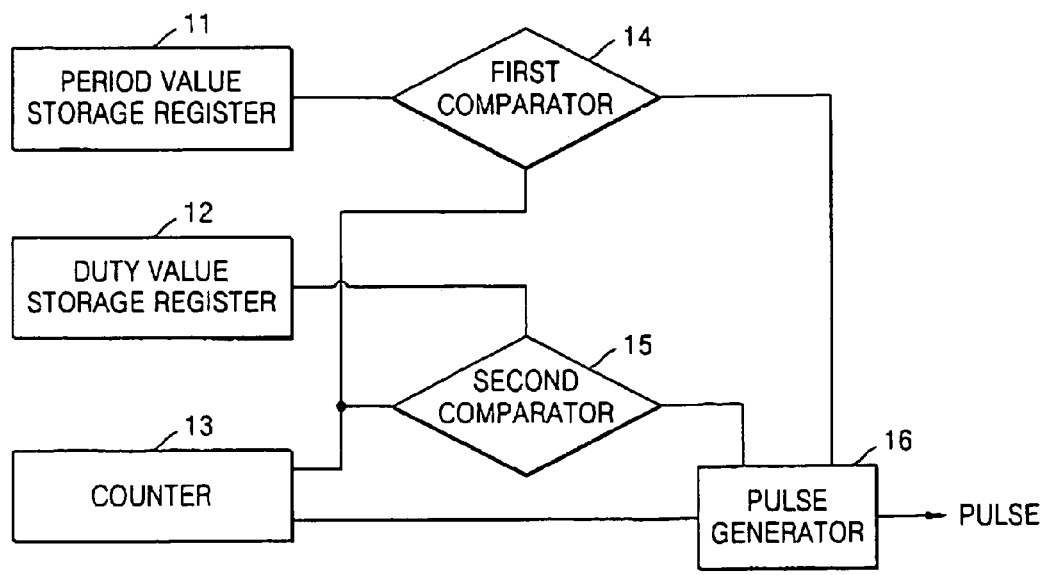
FIG. 1B is a block diagram illustrating a conventional pulse generator for performing the pulse generation method of FIG. 1A.

Hereinafter, example embodiments of the present invention will be described in detail with reference to the accompanying drawings.

In the Figures, the same reference numerals are used to denote the same elements throughout the drawings.

Figure 2:
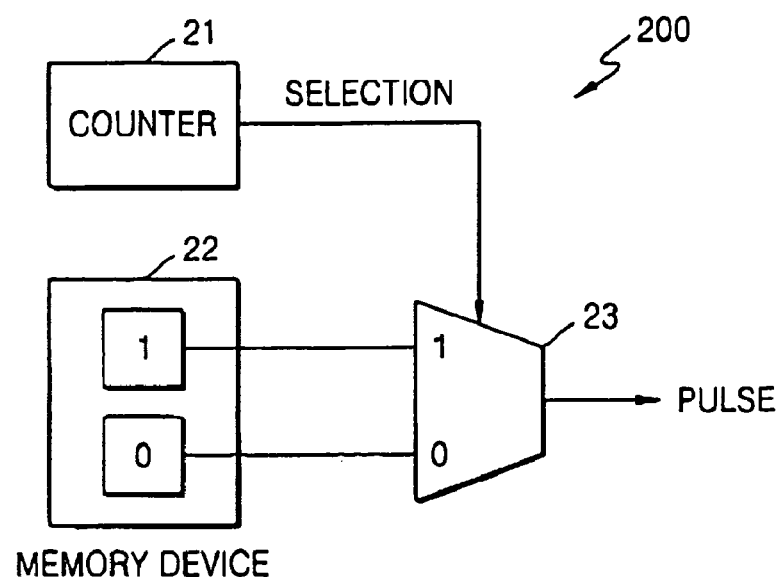
FIG. 2 is a block diagram illustrating a pulse generator according to an example embodiment of the present invention.

FIG. 2 is a block diagram illustrating a pulse generator 200 according to an example embodiment of the present invention. The pulse generator 200 may include a counter 21, a memory device 22 and a multiplexer 23.

In the example embodiment of FIG. 2, a pulse (e.g., a digital pulse) may alternate between a first logic level (e.g., a higher logic level or logic "1") and a second logic level (e.g., a lower logic level or logic "0"). A pulse waveform may be stored in a digital format in the memory device 22. The stored pulse waveform may be converted into a multi-pulse including first and second logic levels.

For example, referring to FIG. 2, assuming a desired pulse waveform has a period of 20 clock cycles and a duty cycle of 7 clock cycles, the multiplexer 23 may output the first logic level (e.g., a higher logic level or logic "1") among the values stored in the memory device 22 while the counter 21 counts from 1 to 7. The multiplexer 23 may output the second logic level (e.g., a lower logic level or logic "0") among the values stored in the memory device 22 while the counter 21 counts from 8 to 20. In this example, the counter 21 may synchronize the above-described example count operation with an external clock signal.

In the example embodiment of FIG. 2, information regarding the pulse state of a multi-pulse may be stored in the memory device 22. For example, the stored information may have a bit size corresponding to an integer multiple of the number of pulses in the multi-pulse. The timing for outputting the pulse state may be controlled by using a timer (e.g., a counter, a clock cycle, etc.), which may thereby allow adjustment to the duty cycle and the period.

In an example, multiple pulses used to control a DC motor may have the same period. In a further example, an economical step motor may use four pulses with a combination of pulse states corresponding to a binary encoding format.

Figure 3:
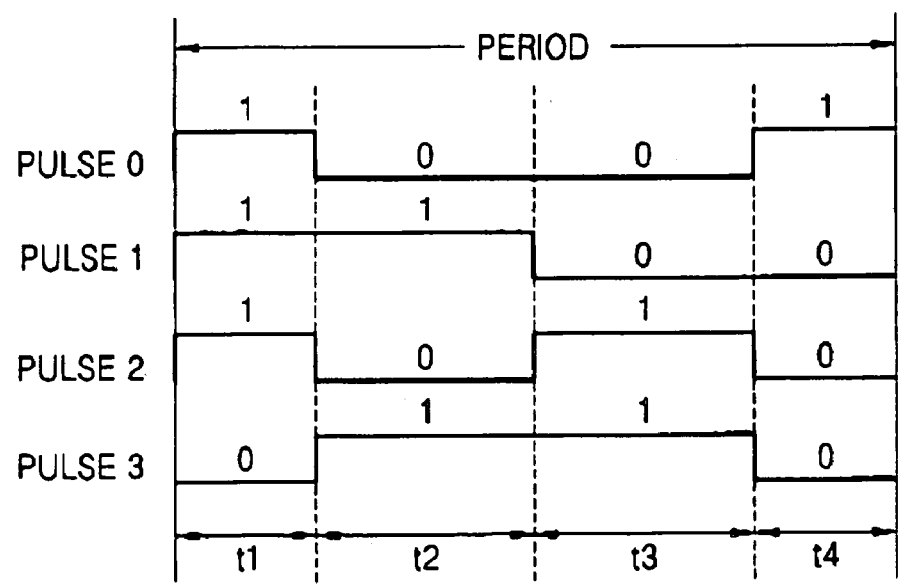
FIG. 3 is a timing chart illustrating four pulses according to another example embodiment of the present invention.

FIG. 3 is a timing chart illustrating four pulses according to another example embodiment of the present invention. FIG. 3 may be directed to controlling a step motor controlled with the four pulses. However, it is understood that other example embodiments of the present invention may be directed to any application of pulses, for example, controlling a device other than a motor and/or controlling a device (e.g., a different type of step motor) with more or fewer than four pulses.

In the example embodiment of FIG. 3, each of Pulse 0, Pulse 1, Pulse 2 and Pulse 3 may have different logic levels (e.g., one of the first logic level and the second logic level, etc.) in each of the time intervals t1-t4, with the logic settings of the Pulses 0-3 within each of the time intervals t1-t4 being a pulse state. Each of the pulse states may maintain its respective logic levels within each of the respective time intervals t1-t4. In addition, each of the Pulses 0-3 may each have the same period. In the example embodiment of FIG. 3, the period for each of Pulses 0-3 may be represented as a sum of the time intervals t1-t4 (e.g., t1+t2+t3+t4) and the duty cycles for Pulses 0-3 may be t1, t2, t3, and t4, respectively. It is understood that other example embodiments of the present invention may include other time intervals (e.g., duty cycles) and periods, and further that other example embodiments may include pulses having different periods and/or duty cycles.

In an example, referring to FIG. 3, the Pulse 0 may transition to the first logic level (e.g., a higher logic level or logic "1") during the duty cycle t1, may transition to the second logic level during the duty cycles t2 and t3 and may transition to the first logic level during the duty cycle t4. The Pulse 1 may transition to the first logic level during duty cycles t1 and t2 and may transition to the second logic level during duty cycles t3 and t4. The Pulse 2 may transition to the first logic level during the duty cycle t1, may transition to the second logic level during the duty cycle t2, may transition to the first logic level during the duty cycle t3 and may transition to the second logic level during the duty cycle t4. The Pulse 3 may transition to the second logic level during the duty cycle t1, may transition to the first logic level during the duty cycles t2 and t3 and may transition to the second logic level during the duty cycle t4.

In a further example, and from the viewpoint of the duty cycle, referring to FIG. 3, in the duty cycle t1, the Pulses 0-2 may be set to the first logic level and Pulse 3 may be set to the second logic level. In the duty cycle t2, the Pulses 0 and 2 may be set to the second logic level and the Pulses 1 and 3 may be set to the first logic level. In the duty cycle t3, the Pulses 0 and 1 may be set to the second logic level and the Pulses 2 and 3 may be set to the first logic level. In the duty cycle t4, the Pulse 0 may be set to the first logic level and the pulses 1-3 may be set to the second logic level.

Figure 4:
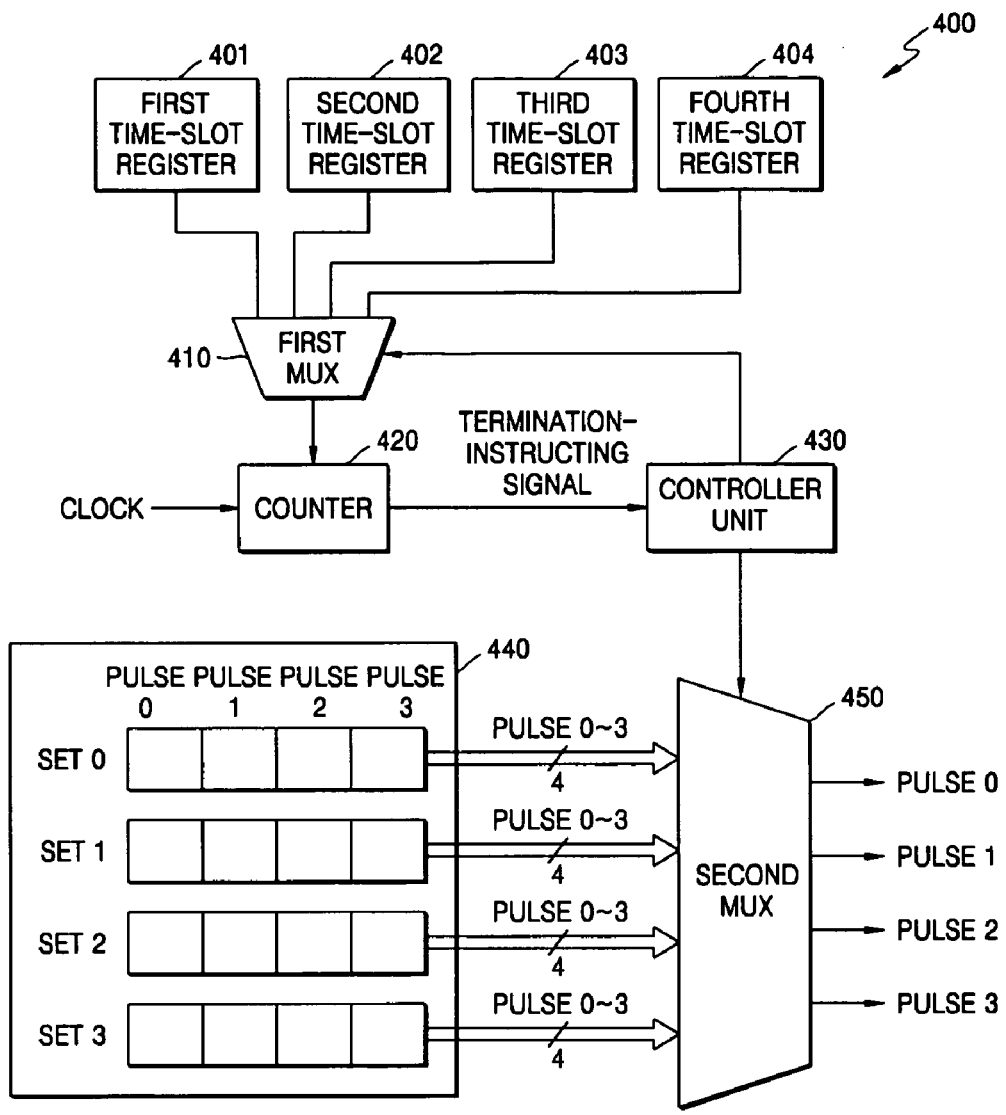
FIG. 4 is a block diagram illustrating a pulse generator 400 according to another example embodiment of the present invention.

FIG. 4 is a block diagram illustrating a pulse generator 400 according to another example embodiment of the present invention. The pulse generator 400 may include time-slot registers 401/402/403/404, a first multiplexer 410, a counter 420, a controller 430, a memory device 440, and a second multiplexer 450.

In the example embodiment of FIG. 4, information associated with the pulse states of duty cycles (e.g., duty cycles t1 through t4) may be stored in the memory device 440. The counter 420 may count a number of clock cycles to monitor the timings of the duty cycles such that pulse states may be output corresponding to the duty cycles.

In the example embodiment of FIG. 4, the time-slot registers 401 through 404 may store timing information (e.g., timing durations or intervals) associated with the duty cycles t1 through t4, respectively, as above-described with respect to FIG. 3. The first time-slot register 401 may store a first timing interval associated with the duty cycle t1, the second time-slot register 402 may store a second timing interval associated with the duty cycle t2, the third time-slot register 403 may store a third timing interval associated with the duty cycle t3 and the fourth time-slot register 404 may store a fourth timing interval associated with the duty cycle t4.

In the example embodiment of FIG. 4, the first multiplexer 410 may select one of the first through fourth timing intervals and may output the selected timing interval received from one of the first through fourth time-slot registers 401/402/403/404 to the counter 420 in response to a control signal of the controller 430.

In the example embodiment of FIG. 4, the counter 420 may receive a clock signal from an external source (e.g., a clock generator) and the selected timing interval received from the first multiplexer 410. The selected timing interval may represent a number of clock signals. The counter 420 may count down from the number represented by the selected timing interval until the number of counts equals the selected timing interval. The counter 420 may then output a termination-instructing signal (e.g., a control signal) to the controller 430 and may receive the timing interval stored in a next time-slot register from the multiplexer 410 as a next selected timing interval and may repeat the above-described down-counting process for the next selected timing interval.

In the example embodiment of FIG. 4, the controller 430 may control the output of the second multiplexer 450 in response to the termination-instructing signal received from the counter 420. For example, if the second multiplexer 450 is outputting a pulse state corresponding to a duty cycle or timing interval being down-counted, the controller 430 may instruct the second multiplexer 420 to halt the output of the pulse state in response to the termination-instructing signal and to begin output of the pulse state corresponding to a next duty cycle or timing interval. Further, the controller 430 may instruct the first multiplexer 410 to output the next selected timing intervals to be counted in a next down-count operation from among the values stored in the time-slot registers 401-404 and received by the multiplexer 410 if the controller 430 receives the termination-instructing signal.

In the example embodiment of FIG. 4, the memory device 440 may store pulse states corresponding to the timing intervals stored in the time-slot registers 401-404. For example, the memory device 440 may include matrix-type or grid-type storage elements. In an example, the number of storage elements may be equal to the number of time-slot registers and may be expressed by $$\text{Time\_Slot}_{Num} = (\text{Pulse}_{Num}) * (\text{Duty\_Cycle}_{Num}) \quad \text{Equation 1}$$

where Time_Slot$_{Num}$ may represent a number of registers in a storage element of the memory device 440, Pulse$_{Num}$ may represent a number of pulses to be generated per timing interval or duty cycle and Duty_Cycle$_{Num}$ may represent a number of duty cycles in a given period. In an example, each of the storage elements in the memory device 440 may store at least one pulse state in binary logic (e.g., to store a pulse corresponding with a higher logic level or logic "1", the storage element may store an associated bit having a binary logic of "1", to store a pulse corresponding with a lower logic level or logic "0", the storage element may store an associated bit having a binary logic of "0", etc.).

In the example embodiment of FIG. 4, the memory device 440 may include memory sets SET0/SET1/SET2/SET3 corresponding to the time-slot registers 401 through 404, respectively. The logic levels of Pulse 0 through Pulse 3 may be stored in the memory sets SET0 through SET 3, respectively. The memory sets SET0 through SET3 may be connected to the second multiplexer 450.

In the example embodiment of FIG. 3, the memory device 440 may store the pulse states as a plurality of binary data bits each having one of the first logic level (e.g., a binary "1") and the second logic level (e.g., a binary "0").

In the example embodiment of FIG. 4, the second multiplexer 450 may output data stored in a memory set (e.g., one of memory sets SET0 through SET3) corresponding to the duty cycle being currently down-counted at the counter 420 in response to the control signal received from the controller 430. For example, if the counter 420 is down-counting the duty cycle stored in the first time-slot register 401, the second multiplexer 450 may output the pulse state stored in the memory set SET0 (e.g., if time-slot register 401 corresponds to duty cycle t1 of FIG. 3, the output may be the pulse state of pulses 0-3 having binary logic levels of "1", "1", "1" and "0", respectively). When the down-count operation for the duty cycle stored in the first time-slot register 401 is completed, the second multiplexer 450 may output the pulse state stored in the memory set SET1 corresponding to the second time-slot register 402 (e.g., if time-slot register 402 corresponds to duty cycle t2 of FIG. 3, the output may be the pulse state of Pulses 0-3 having binary logic levels of "0", "1", "0" and "1", respectively). When the down-count operation for the duty cycle stored in the second time-slot register 402 is completed, the second multiplexer 450 may output the pulse state stored in the memory set SET2 corresponding to the third time-slot register 403 (e.g., if time-slot register 403 corresponds to duty cycle t3 of FIG. 3, the output may be the pulse state of Pulses 0-3 having binary logic levels of "0", "0", "1" and "1", respectively). When the down-count operation for the duty cycle stored in the third time-slot register 403 is completed, the second multiplexer 450 may output the pulse state stored in the memory set SET3 corresponding to the fourth time-slot register 404 (e.g., if time-slot register 404 corresponds to duty cycle t4 of FIG. 3, the output may be the pulse state of Pulses 0-3 having binary logic levels of "1", "0", "0" and "0", respectively). When the down-count operation for the duty cycle stored in the fourth time-slot register 404 is completed, the second multiplexer 450 may again output the pulse state stored in the memory set SET0 corresponding to the first time-slot register 401.

An example operation of the pulse generator 400 according to another example embodiment of the present invention will now be described with reference to FIGS. 3 and 4.

In the example operation of the pulse generator 400, referring to FIGS. 3 and 4, the memory set SET0 in the memory device 440 may store a first pulse state of (1, 1, 1, 0) corresponding to Pulses 0-3, respectively, in the duty cycle t1. The memory set SET1 may store a second pulse state of (0, 1, 0, 1) corresponding to Pulses 0-3, respectively, in the duty cycle t2. The memory set SET2 may store a third pulse state of (0, 0, 1, 1) corresponding to Pulses 0-3, respectively, in the duty cycle t3. The memory set SET3 may store a fourth pulse state of (1, 0, 0, 0) corresponding to Pulses 0-3, respectively, in the duty cycle t4. Each of the first through fourth pulse states may be stored in association with the respective time interval associated with the duty cycles t1-t4, hereinafter referred to as first through time intervals, respectively.

In the example operation of the pulse generator 400, referring to FIGS. 3 and 4, the time-slot registers 401 through 404 may store the first through fourth time intervals associated with the duty cycles t1 through t4 as representative of a number of counts of the counter 420 based on an external clock signal.

In the example operation of the pulse generator 400, referring to FIGS. 3 and 4, the first time interval (e.g., corresponding to duty cycle t1) stored in the first time-slot register 401 may be loaded into the counter 420 to initiate a first down-count operation. During the first down-count operation, the first pulse state (1, 1, 1, 0) stored in the memory set SET0 may be output as pulses Pulses 0-3, respectively. Thus, for the duty cycle t1, the Pulses 0-2 may be set to the first logic level, and the Pulse 3 may be set to the second logic level.

In the example operation of the pulse generator 400, referring to FIGS. 3 and 4, the counter 420 may down-count until the first down-count operation may complete (e.g., down-count to a zero value or for a number of clock cycles equal to the first time interval). When the first down-count operation is completed, the counter 420 may begin a second down-count operation by loading the second time interval into the counter 420. The second multiplexer 450 may output the second pulse state (0, 1, 0, 1) stored in the memory set SET1 as the pulses Pulse 0 through Pulse 3, respectively, for the duration of the second down-count operation. Thus, for the duty cycle t2, the Pulses 1 and 3 may be set to the first logic level, and the Pulses 0 and 2 may be set to the second logic level.

In the example operation of the pulse generator 400, referring to FIGS. 3 and 4, the counter 420 may down-count until the second down-count operation may complete (e.g., down-count to a zero value or for a number of clock cycles equal to the second time interval). When the second down-count operation is completed, the counter 420 may begin a third down-count operation by loading the third time interval into the counter 420. The second multiplexer 450 may output the third pulse state (0, 0, 1, 1) stored in the memory set SET2 as the pulses Pulse 0 through Pulse 3, respectively, for the duration of the third down-count operation. Thus, for the duty cycle t3, the Pulses 2 and 3 may be set to the first logic level, and the Pulses 0 and 1 may be set to the second logic level.

In the example operation of the pulse generator 400, referring to FIGS. 3 and 4, the counter 420 may down-count until the third down-count operation may complete (e.g., down-count to a zero value or for a number of clock cycles equal to the third time interval). When the third down-count operation is completed, the counter 420 may begin a fourth down-count operation by loading the fourth time interval into the counter 420. The second multiplexer 450 may output the fourth pulse state (1, 0, 0, 0) stored in the memory set SET3 as the pulses Pulse 0 through Pulse 3, respectively, for the duration of the fourth down-count operation. Thus, for the duty cycle t4, the Pulse 1 may be set to the first logic level, and the Pulses 2-3 may be set to the second logic level.

In the example operation of the pulse generator 400, referring to FIGS. 3 and 4, after the counter 420 completes the fourth down-count operation, the above-described operations may repeat again starting with the first down-count operation.

In the example operation of the pulse generator 400, referring to FIGS. 3 and 4, the above-described example operation may repeatedly generate the multi-pulse illustrated in FIG. 3 using the pulse generator 400 of FIG. 4. It is understood that other example embodiments of the present invention may be directed to pulse generators generating any number of pulses (e.g., greater or fewer than four). It is further understood that other example embodiments of the present invention may be directed to pulse generators having any number of duty cycles (e.g., greater or fewer than four).

In another example embodiment of the present invention, if the waveform characteristics of a pulse are changed, the memory device 440 and the first through fourth time-slot registers 401-404 may be updated with the change such that the pulse generator may adapt in response to different pulse state requirements and/or different duty cycle durations or numbers (e.g., by adjusting a value stored in one of the time-slot registers 401-404 and/or adding additional time-slot registers).

In another example embodiment of the present invention, a pulse generator (e.g., pulse generator 400) may output a multi-pulse with any number of duty cycles and with any of a plurality of pulse states without requiring additional hardware (e.g., other than memory storage) and thereby with a reduced number of gates. Thus, a chip size of a semiconductor chip may be reduced by incorporating a pulse generator according to an example embodiment of the present invention as opposed to the conventional use of parallel processing hardware.

For example, assuming that an integer P is positive and at least equal to 1, the conventional art may require P counters and P comparators (or controllers) for generating P pulses, whereas an example embodiment of the present invention may include a single counter and a single comparator for generating the P pulses. Thus, example embodiments of the present invention may scale their pulse generation capacity without additional counters, controllers, and/or comparators.

Example embodiments of the present invention being thus described, it will be obvious that the same may be varied in many ways. For example, it is understood that the above-described first and second voltage levels may correspond to a higher level (e.g., logic "1") and a lower logic level (e.g., logic "0"), respectively, in an example embodiment of the present invention. Alternatively, the first and second voltage levels may correspond to the lower logic level (e.g., logic "0") and the higher logic level (e.g., logic "1"), respectively, in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A pulse generator for generating a plurality of pulse signals, comprising:
   a first switching unit receiving a plurality of time interval indicators and a first selection signal, selecting one of the plurality of time interval indicators in accordance with the first selection signal and outputting the selected time interval indicator; and
   a second switching unit receiving a plurality of pulse states and a second selection signal, selecting one of the plurality of pulse states in accordance with the second selection signal and outputting the selected pulse state for a first time interval, the first time interval determined by the selected time interval indicator.

2. The pulse generator of claim 1, wherein the plurality of time interval indicators are received from a plurality of time-slot registers.

3. The pulse generator of claim 1, wherein the plurality of pulse states are received from a pulse state storage unit.

4. The pulse generator of claim 3, wherein the pulse state storage unit includes a plurality of storage elements and each of the plurality of storage elements stores one of the plurality of pulse states.

5. The pulse generator of claim 3, wherein the pulse state storage unit stores each of the plurality of pulses as a binary data bit.

6. The pulse generator of claim 1, wherein at least one of the first and second switching units includes a multiplexer.

7. The pulse generator of claim 1, further comprising:
   a timer receiving the selected time interval indicator, first counting down from the selected time interval indicator, and outputting a control signal to indicate when the first count-down is completed, the duration of the first count down being the first time interval.

8. The pulse generator of claim 7, wherein the timer times the first count down based on an external clock signal.

9. The pulse generator of claim 7, further comprising:
   a controller receiving the control signal from the timer and instructing the first switching unit to select a next one of the plurality of time interval indicators as a next selected time interval indicator.

10. The pulse generator of claim 9, wherein the timer receives the next selected time interval indicator, second counts down from the next selected time interval indicator and outputs the control signal to indicate when the second count down is completed, the duration of the second count down being the second time interval.

11. The pulse generator of claim 1, wherein a number of the received plurality of time interval indicators corresponds to a number of the received plurality of pulse states, the number related to a number of duty cycles in a given period.

12. The pulse generator of claim 1, wherein each of the plurality of pulses is associated with one of a higher logic level and a lower logic level.

13. The pulse generator of claim 1, wherein the plurality of pulse states are used to control a direct current (DC) motor.

14. The pulse generator of claim 1, wherein at least one of the received plurality of time interval indicators and the received plurality of pulse states is adjusted.

15. A method of generating a plurality of pulse signals with the pulse generator of independent claim 1.

16. A method of generating a plurality of pulse signals, comprising:
   receiving a plurality of time interval indicators, each of the plurality of time interval indicators associated with one of a plurality of pulse states;
   selecting a first of the plurality of time interval indicators, the first of the plurality of time interval indicators indicating a first time interval; and
   outputting a first of the plurality of pulse states for the first time interval.

17. The method of claim 16, further comprising:
   determining when the first time interval is over;

selecting a second of the plurality of time interval indicators, the second of the plurality of time interval indicators indicating a second time interval; and
outputting a second of the plurality of pulse states for the second time interval.

18. The method of claim 17, wherein the first of the plurality of time interval indicators indicates a number of clock cycles associated with the first time interval and the determining determines the first time interval is over after counting a number of clock cycles equal to the first of the plurality of time interval indicators.

19. The method of claim 17, further comprising:
outputting a control signal indicating the first time interval is over when the determining determines the first time interval is over, wherein the selecting selects the second of the plurality of time interval indicators based on the output control signal.

20. The method of claim 16, wherein the selecting selects the first of the plurality of time interval indicators based on a received control signal.

* * * * *